Feb. 28, 1961 R. F. DE ROY 2,973,484

FREQUENCY DIVISION SYSTEM FOR ELECTRONIC ORGAN OR THE LIKE

Filed Sept. 16, 1958

INVENTOR.

ROSS F. DEROY

BY *Shapiro and Shapiro*

ATTORNEYS

United States Patent Office 2,973,484

Patented Feb. 28, 1961

2,973,484

FREQUENCY DIVISION SYSTEM FOR ELECTRONIC ORGAN OR THE LIKE

Ross F. De Roy, 1500 N. Patrick Henry Drive, Apt. 149, Arlington, Va.

Filed Sept. 16, 1958, Ser. No. 761,430

5 Claims. (Cl. 331—51)

This invention relates to a frequency division system and more particularly to a frequency division system for an electronic organ, including a plurality of stable relaxation oscillators capable of producing sawtooth waves of good wave form.

It is known in the art of electronic organs to employ one or more master oscillators and a plurality of frequency dividers to produce a wide range of frequencies which may be combined or modified so as to produce the desired tones, chords, or other musical sounds. Since a large number of frequencies is required, the frequency divider circuits become quite complex, involving large numbers of tubes and passive elements such as resistors and capacitors. The need for maintaining frequency stability makes the complexity even greater, because the circuits must be arranged so that there is little interaction between them, that is, so that the generation of a frequency in one circuit will not affect the generation of a different frequency in another circuit. The maintenance of frequency stability often requires the addition of numerous decoupling circuits or isolating stages to prevent interaction of the various frequency generators. The circuits used heretofore are thus complex, uneconomical, and frequently require critical adjustment.

The present invention overcomes the foregoing disadvantages of the prior art arrangements by providing a system that is simple, economical, uncritical, and inherently stable. It is accordingly a principal object of the invention to provide such a system.

Another object of the invention is to provide a novel relaxation oscillator employing a single gaseous discharge tube or the like and two simple time constant circuits.

A further object of the invention is to provide an oscillator of the foregoing type that is externally triggered and that produces an output wave form free of the triggering wave form.

Yet another object of the invention is to provide a frequency divider system comprising a plurality of relaxation oscillators of the foregoing type, which are readily triggered from a single master oscillator and which produce different frequencies without interaction.

The foregoing and other objects, features, and advantages of the invention will become more readily apparent upon consideration of the following detailed description of the invention when taken in conjunction with the accompanying drawings, which illustrate preferred and exemplary embodiments of the invention and wherein.

Figure 1:
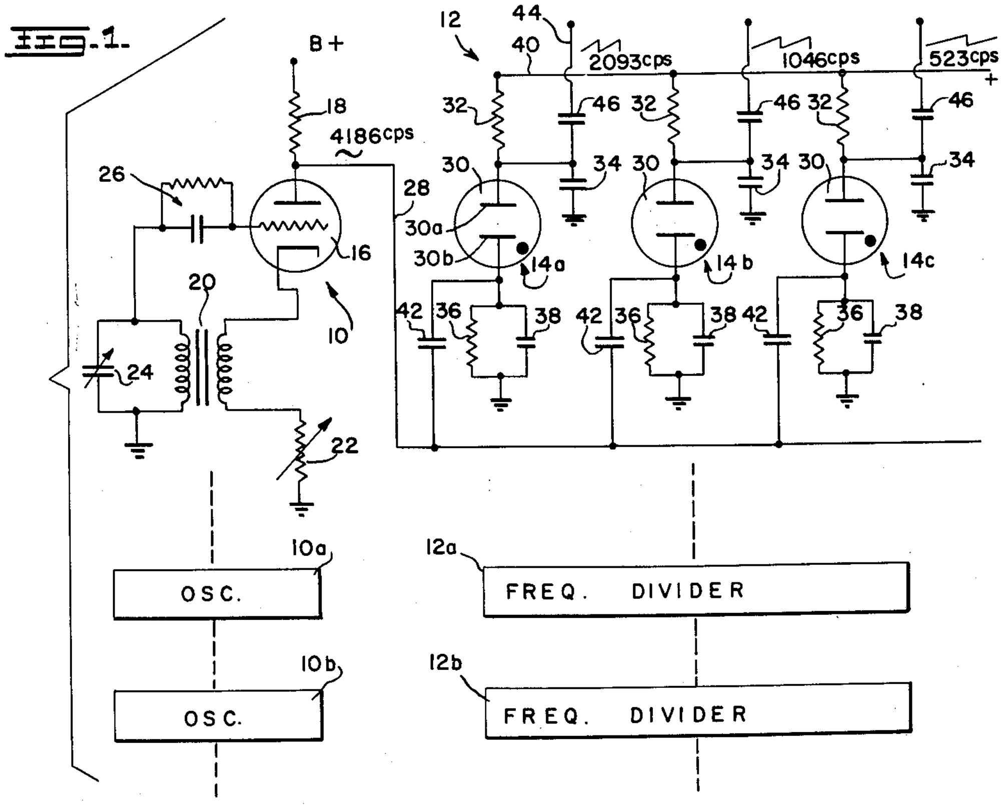
Figure 1 is a schematic, partially block diagram illustrating one form of the system of the invention.

Referring to the drawings, in Figure 1 a master oscillator 10 is employed for triggering an associated frequency divider 12. The frequency divider comprises a group of relaxation oscillators designated **14*a*, 14*b*, 14*c*, etc. When the invention is used in an electronic organ, the master oscillator 10 may produce a frequency corresponding to the C of the top octave of the piano, for example, and each of the relaxation oscillators of the divider 12 may produce a frequency corresponding to C's of successively lower octaves. For example, oscillator 10 may have a fundamental frequency of 4186 cycles per second; oscillator 14*a* may have a fundamental frequency of 2093 cycles per second; oscillator 14*b* a fundamental frequency of 1046 cycles per second, and oscillator 14*c* a fundamental frequency of 523 cycles per second. Other master oscillators, including 10*a*, 10*b* and succeeding oscillators may be employed to produce the fundamental frequencies of the other notes of the chromatic scale of the top octave of the piano, as the highest A, the highest B, etc. Associated frequency dividers 12*a*, 12*b*, etc. having relaxation oscillator groups like those of divider 12** may be used to produce the lower notes corresponding to the associated master oscillator.

From the frequency values given adjacent oscillators **10, 14*a*, 14*b*, and 14*c***, it is apparent that each relaxation oscillator produces a fundamental frequency that is half the frequency of the preceding oscillator. As will become apparent, the outputs of the relaxation oscillators are pure sawtooth waves, and in an electronic organ these waves may be applied to suitable filter and mixer networks for obtaining the desired tones, chords, or other musical sounds.

The master oscillators, such as oscillator 10, may assume many conventional forms, a simple tuned grid circuit sinewave oscillator being shown for illustrative purposes. This oscillator includes a triode 16 having its plate connected to a source of plate supply voltage through a plate resistor 18. The cathode of the tube 16 includes the primary of a feed-back transformer 20 and a variable resistor 22 in series. The bottom of resistor 22 may be grounded to complete the circuit back to the grounded terminal of the power supply. The secondary of transformer 20 is tuned by a variable condenser 24. The bottom of this LC network is grounded, and the top is connected to a parallel RC bias network 26 and then to the grid of the triode 16. The output line 28 may be connected to the plate of the tube 16 and as will be seen hereinafter provides triggering potentials for the relaxation oscillators of the frequency divider 12.

Each relaxation oscillator comprises a two electrode gaseous discharge tube 30, which preferably is an inexpensive neon bulb such as the NE–2 type. One electrode **30*a* of each tube 30 is connected to an associated first time constant circuit including a resistor 32 and a condenser 34, and the other electrode 30*b* is connected to a second time constant circuit including a resistor 36 and a condenser 38. Resistors 32 connect the respective tubes to a power supply line 40, to which is applied a regulated potential higher than the striking potential of tubes 30. Condenser 34 charges through resistor 32 from the power supply line 40, one side of the condenser being grounded to complete the charging circuit to the corresponding terminal of the power supply. It will be apparent that if tube 30 is made conductive, condenser 34** will discharge through the tube.

Resistor 36 and condenser 38 constitute a parallel circuit connected between the said electrode **30*b* of tube 30 and ground. The triggering potential on line 28 is coupled by condensers 42 to an electrode of each of the tubes 30, the electrode 30*b* in the form shown in Fig. 1. An output potential is derived from the electrode 30*a* by a lead 44 connected to this electrode through a coupling condenser 46**.

The parameters of the relaxation oscillator circuits are chosen so that each circuit will oscillate at a fundamental frequency less than the desired output frequency for that oscillator in the absence of triggering. The action of the relaxation oscillator 14a with triggering is typical and may be described as follows: With the tube 30 nonconductive, condenser 34 charges through resistor 32 from the power supply line 40. At some time prior to the instant at which the potential across condenser 34 would be sufficient to fire the tube, a triggering potential is applied to electrode 30b of the tube. The circuit constants are chosen so that at some point in the cycle of the triggering potential, the electrode 30b will be made sufficiently negative with respect to the positive potential on the electrode 30a to cause the tube 30 to fire and conduct. When his occurs, the condenser 34 will discharge through the tube 30 into the time constant circuit 36, 38. The potential across the tube will drop as condenser 34 discharges, and resistor 32 being large enough to prevent continuous firing of the tube 30, the tube will again become nonconductive. Condenser 34 will then recharge from the power supply line 40, and condenser 38, which has been charged by the discharge of condenser 34, will commence to discharge through the resistor 36.

The potential at the output lead 44 will be a sawtooth, as shown, the rising portion of the sawtooth corresponding to the charging of condenser 34 and the falling portion of the sawtooth corresponding to the discharging of condenser 34. It will be noted that this sawtooth wave is entirely free of any triggering wave form. The reason for this is that tube 30 constitutes a high impedance in its nonconductive state, so that when tube 30 is nonconductive the time constant circuit 32, 34 is isolated from the triggering circuit. Hence, the rising portion of the sawtooth is contributed entirely by the charging of condenser 34 from the regulated power supply line 40 through resistor 32. When tube 30 conducts, condenser 34 discharges very rapidly through the low impedance which the tube now constitutes, and when the voltage across condenser 34 drops due to the discharge, the tube 30 cuts off rapidly, so that the entire falling portion of the sawtooth occurs within a very short interval, and the existence of the triggering wave at electrode 30b of tube 30 is of no consequence.

For optimum results, the time constants of the circuits connected to the respective electrodes of the tube 30 of any of the relaxation oscillators should be approximately equal. The capacitance of coupling condensers 42 and 46 should be small compared to the capacitance of time constant condensers 34 and 38 (preferably not over 10%).

The time constants of the oscillator 14a are chosen so that the corresponding tube 30 will only fire on every other cycle of the master oscillator 10. The operation of the remaining relaxation oscillators of divider 12 is the same as oscillator 14a, but the time constants of the successive relaxation oscillators are selected so that these oscillators fire only on every fourth, eighth, etc. cycle of the master oscillator. This is readily achieved in practice by making the triggering potential a relatively small fraction of the total striking potential of the tubes 30, so that the condensers 34 must be almost completely charged to the striking potential before the corresponding tubes can fire.

In the form of the circuit shown in Figure 1, the relaxation oscillators may be triggered by sinewave oscillations, or by negative pulses, for example. Furthermore, within the broader aspects of the invention, the successive relaxation oscillators may be connected in cascade, so that each oscillator triggers the succeeding oscillator. This arrangement is somewhat more complex than the form illustrated, however.

Figure 2:
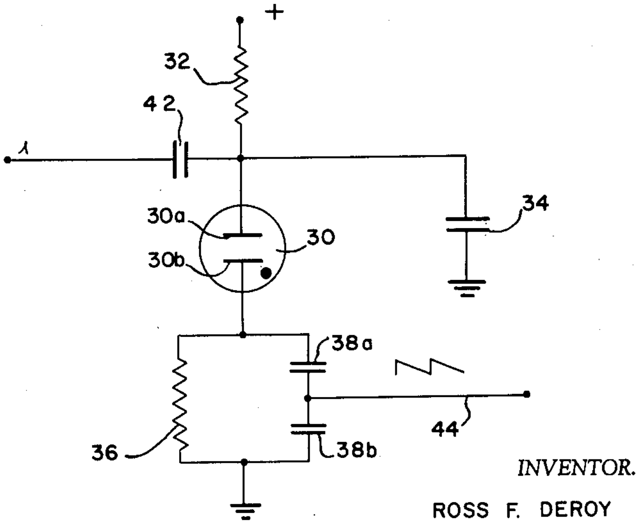
Figure 2 is a schematic diagram of a modification of a portion of the system of Figure 1.

Figure 2 illustrates a modified form of the relaxation oscillator of the invention. This form may be used to obtain sawtooth waves having their polarity reversed with respect to the polarity of the sawtooth waves obtained in Figure 1. The reference numerals common to Figures 1 and 2 designate the same parts. In the embodiment of Figure 2 the triggering voltage is applied to the electrode 30a of tube 30 and is in the form of a positive pulse, although sinewave or sawtooth triggering could also be used. The output is taken from the time constant network associated with the electrode 30b, and the condenser 38 is replaced by two condensers 38a and 38b to provide a voltage divider which determines the amplitude of the output wave. The rising portion of the sawtooth produced by this circuit occurs during the discharge of condenser 34 through the conductive tube 30, charging condensers 38a and 38b. Tube 30 conducts when the combined potential provided by the condenser 34 and the triggering pulse is sufficient to fire the tube, and when the condenser 34 discharges, the potential across tube 30 quickly becomes less than the potential necessary to maintain discharge, and tube 30 ceases to conduct. When this occurs, condensers 38a and 38b discharge through resistor 36, providing the falling portion of the sawtooth. It will be observed that in Figure 2 as in Figure 1 the triggering wave is isolated from the output except for the instant when the tube 30 is conductive. Hence, there is no superposition of the triggering and sawtooth wave forms at the output.

From the foregoing description of the invention it will be apparent to those skilled in the art that the invention provides frequency dividers that are simple and economical and yet stable and free of interaction. The maintenance of this frequency stability will of course depend upon the use of resistors and condensers of reasonably good quality, but inexpensive neon tubes may be used for the gas tubes 30 if they are aged for a short time prior to their operation in the circuit. It will be apparent that the relaxation oscillators employed in the invention require only one tube and relatively few and inexpensive passive components. Multiple frequencies of pure sawtooth wave form are produced by the invention, and positive and negative polarities may be readily obtained.

While preferred forms of the invention have been shown and described, it will be appreciated by those skilled in the art that changes can be made in these forms without departing from the principles and spirit of the invention, the scope of which is defined in the appended claims. Accordingly, the foregoing embodiments are to be considered illustrative, rather than restrictive of the invention, and those modifications which come within the meaning and range of equivalency of the claims are to be included therein.

The invention claimed is:

1. A relaxation oscillator comprising a single gaseous discharge tube having only two electrodes, a source of supply potential for said tube, a resistor connected from one terminal of said source to one of said electrodes, a condenser connected from said one electrode to the other terminal of said source, a second resistor connected from the other of said electrodes to said other terminal, a second condenser connected across said second resistor, means for applying a triggering potential to the circuit connected to one of said electrodes, and means for deriving an output from the circuit connected to the other of said electrodes.

2. A frequency divider system comprising a plurality of the relaxation oscillators recited in claim 1, the parameters of the respective oscillators being selected to cause the oscillators to oscillate at successively lower natural frequencies, said means for applying a triggering potential comprising a common master oscillator connected to each of said relaxation oscillators.

3. The system of claim 2, each relaxation oscillator frequency corresponding to a note within an octave of the chromatic scale.

4. The system of claim 3, further comprising additional relaxation oscillators and master oscillators connected as aforesaid, the additional oscillators having frequencies corresponding to other notes of the chromatic scale.

5. The oscillator of claim 1, said tube being a neon tube.

References Cited in the file of this patent

UNITED STATES PATENTS

| | | |
|---|---|---|
| 2,044,360 | Langer | June 16, 1936 |
| 2,152,822 | Schlesinger | Apr. 4, 1939 |
| 2,456,700 | Haantjes | Dec. 21, 1948 |
| 2,680,198 | Bick | June 1, 1954 |

OTHER REFERENCES

"A Tubeless Saw-Tooth Oscillator," by Louis, in Radio and Television News, May 1952, pages 52, 53, 173.